(12) United States Patent
Li et al.

(10) Patent No.: US 9,713,273 B2
(45) Date of Patent: Jul. 18, 2017

(54) FIREPROOF SEPARATOR BOARD AND PLUG-BASED CIRCUIT INTERRUPTER EMPLOYING THE FIREPROOF BOARD

(71) Applicant: Chengli Li, Suzhou (CN)

(72) Inventors: Chengli Li, Suzhou (CN); Fei Lin, Suzhou (CN); Xiaoming Zhang, Suzhou (CN)

(73) Assignee: CHENGLI LI, Suzhou (CN)

( * ) Notice: Subject to any disclaimer, the term of this patent is extended or adjusted under 35 U.S.C. 154(b) by 581 days.

(21) Appl. No.: 14/302,685

(22) Filed: Jun. 12, 2014

(65) Prior Publication Data
US 2015/0327380 A1    Nov. 12, 2015

(30) Foreign Application Priority Data

May 9, 2014 (CN) .......................... 2014 1 0193951
May 9, 2014 (CN) .......................... 2014 2 0235065

(51) Int. Cl.
*H02H 9/00* (2006.01)
*H05K 5/02* (2006.01)

(52) U.S. Cl.
CPC ........... *H05K 5/0213* (2013.01); *H02H 9/005* (2013.01)

(58) Field of Classification Search
CPC .................................................. H05K 5/0213

USPC .......................................................... 361/118
See application file for complete search history.

(56) References Cited

U.S. PATENT DOCUMENTS

| | | | | |
|---|---|---|---|---|
| 3,884,380 A | * | 5/1975 | Prochnow | A45C 11/38 206/316.1 |
| 5,556,192 A | * | 9/1996 | Wang | A01M 1/2077 362/253 |
| 5,905,622 A | * | 5/1999 | Finlay, Sr. | H01C 7/12 361/111 |
| 6,429,407 B1 | * | 8/2002 | Garber | A47J 37/0814 219/386 |

FOREIGN PATENT DOCUMENTS

CN 203607348 U 5/2014

* cited by examiner

*Primary Examiner* — Stephen W Jackson
(74) *Attorney, Agent, or Firm* — Chen Yoshimura LLP

(57) ABSTRACT

This invention provides a fireproof separator board, which is made of a flame-retardant, high temperature resistant material and disposed within an insulating casing of an electrical device, for preventing the heat generated by the electrical components of the electrical device from being conducted to the insulating casing. This invention also provides a plug-based circuit interrupter that includes the fireproof separator board. The fireproof separator board and the plug-based circuit interrupter of this invention can effectively prevent high temperature and fire caused by the electrical components that could melt the casing.

9 Claims, 6 Drawing Sheets

FIREPROOF SEPARATOR BOARD AND PLUG-BASED CIRCUIT INTERRUPTER EMPLOYING THE FIREPROOF BOARD

BACKGROUND OF THE INVENTION

Field of the Invention

This invention relates to a fireproof separator board and a plug-based circuit interrupter for employing the fireproof board.

Description of the Related Art

Chinese patent ZL 201320681266.8 describes a typical plug-based circuit interrupter. Because the plug-based circuit interrupter has a small space in its interior, and its outer casing is usually made of plastic, the contact terminals of the circuit interrupter can generate high temperature arcs at the moment of their separation. Also, during long time use of electrical conduction, the surface of the contact terminals can be burned or oxidized, which can increase the resistance of the contact terminals and significantly increase their temperature. The above two phenomena can cause the plastic casing to deform, melt, burn, and causing fire.

Further, because the PCB within a plug-based circuit interrupter has numerous electrical components, in particular varistors, if the plug is struck by lightning during operation, it may combust and burn the casing. Therefore, in practical use, there is a need to protect the casing from being burnt.

SUMMARY OF THE INVENTION

To solve the above problems, the present invention provides a fireproof separator board and a plug-based circuit interrupter employing the fireproof board, which can effectively prevent the high temperature generated by the contact terminals from causing combustion and burning the casing.

In a first aspect, the present invention provides a fireproof separator board, formed of a flame retardant, high temperature resistant material, disposed within an insulating casing of an electrical device, for preventing heat generated by electrical components of the electrical device from being conducted to the insulating casing.

Preferably, the fireproof separator is formed of epoxy board, asbestos board, mica plate, metal plate, or a ceramic material.

Preferably, the fireproof separator board is disposed perpendicularly between the casing and the electrical components.

Preferably, the fireproof separator board is disposed below a circuit board of the electrical device and parallel to the circuit board, and the electrical components pass through the fireproof separator board.

In a second aspect, the present invention provides plug-based circuit interrupter, which includes:

an insulating casing;

a control circuit board, disposed horizontally inside the insulating casing, the control circuit board including a first contact terminal, a second contact terminal, and a varistor;

a first metal insertion plate and a second metal insertion plate, passing through a bottom of the insulating casing and being disposed vertically, the first and second metal insertion plates being connected to or disconnected from the respective first and second contact terminals to close or open an electrical circuit;

the circuit interrupter further including a fireproof separator board, formed of a flame retardant, high temperature resistant material, disposed within the insulating casing, for preventing heat generated by the first and second contact terminals from being conducted to the insulating casing.

Preferably, the fireproof separator board is formed of epoxy board, asbestos board, mica plate, metal plate, or a ceramic material.

Preferably, the circuit interrupter includes two fireproof separator boards, the two fireproof separator boards being disposed vertically and respectively between two side walls of the insulating casing and the first and second contact terminals.

Preferably, the fireproof separator board is disposed below the control circuit board and parallel to the control circuit board, and the first and second metal insertion plates pass through the fireproof separator board.

Preferably, the fireproof separator board extends below the varistor of the control circuit board.

Preferably, an end of the fireproof separator board near the casing is disposed vertically between the first and second contact terminals.

In a third aspect, the present invention provides a plug-based circuit interrupter, which includes:

an insulating casing;

a control circuit board disposed inside the insulating casing and including a varistor;

a stationary contact terminal and a moving contact terminal, disposed inside the insulating casing and above the control circuit board; and a fireproof separator board, disposed above the stationary contact terminal and the moving contact terminal, which cooperates with the control circuit board to prevent heat generated by the stationary contact terminal and the moving contact terminal from being conducted to the insulating casing.

Preferably, the fireproof separator board extends above the varistor of the control circuit board.

Preferably, the fireproof separator board is formed of epoxy board, asbestos board, mica plate, metal plate, or a ceramic material.

The fireproof separator board and the plug-based circuit interrupter of the present invention can effectively prevent the high temperature and fire caused by the contact terminals, which could melt the casing. Therefore, the casing is protected. Further, by extending the high temperature resistant fireproof separator board above the varistor on the circuit board, it can prevent combustion of the varistor caused by lightning strike from burning the casing.

DETAILED DESCRIPTION OF THE PREFERRED EMBODIMENTS

Figure 1:
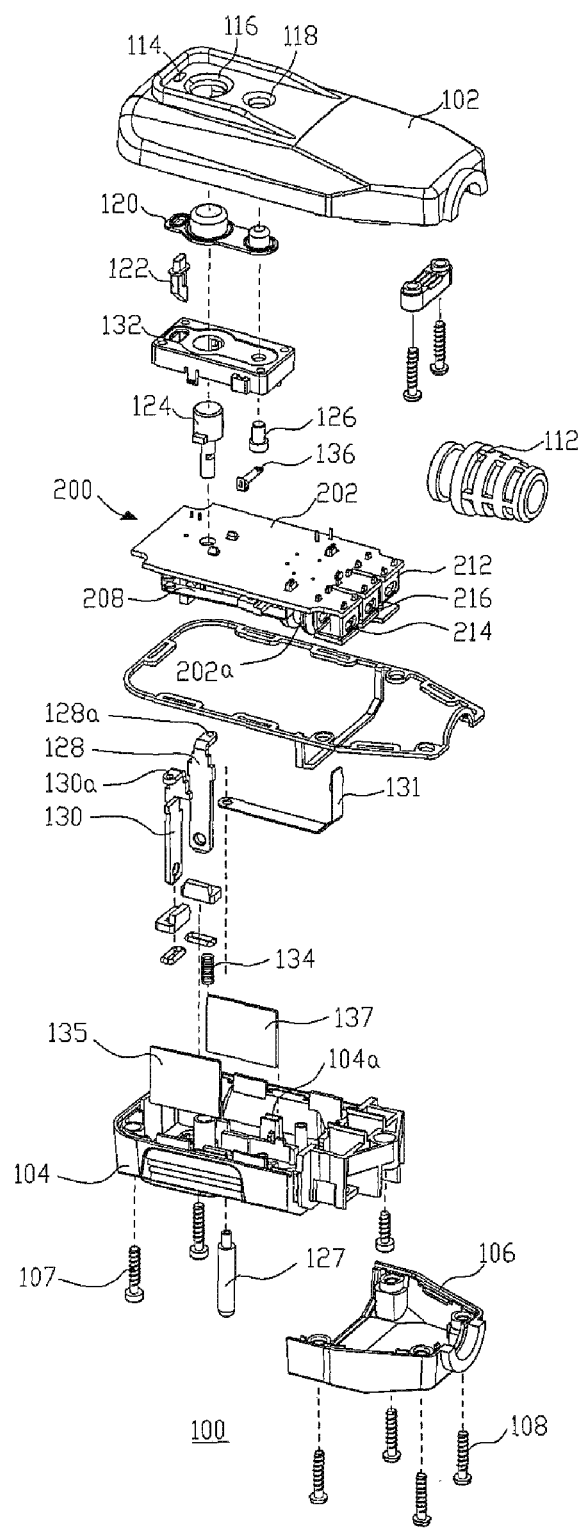
FIG. 1 is an exploded perspective view of the plug-based circuit interrupter of the present invention.

A fireproof separator board according to the present invention is formed of a flame retardant, high temperature resistant material; it is disposed within an insulating casing of an electrical device, for preventing the heat generated by electrical components of the electrical device from being conducted to the insulating casing. Preferably, the fireproof separator is formed of epoxy board, asbestos board, mica plate, metal plate, or a ceramic material. According to one embodiment, the fireproof separator board is disposed perpendicularly between the casing and the electrical components. According to another embodiment, the fireproof separator board is disposed below a circuit board of the electrical device and parallel to the circuit board, and the electrical components pass through the fireproof separator board.

The structure and principle of the present invention is explained in detail below using a plug-based circuit interrupter as an example, with reference to the drawings. In the drawings, the same or similar reference symbols denote the same or similar components. The structure of plug-based circuit interrupter is well known in the art, for example Chinese patent ZL 201320681266.8 describes a typical plug-based circuit interrupter; therefore, a detailed description of it is omitted here.

Figure 2:
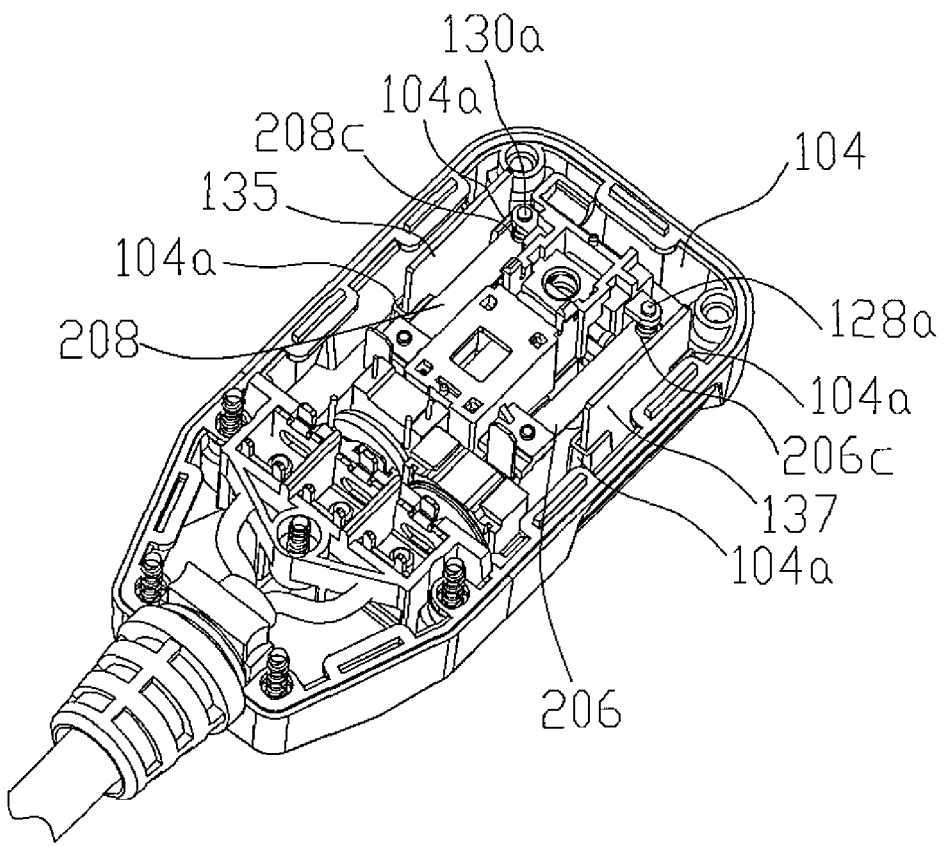
FIG. 2 illustrates the fireproof separator boards of the circuit interrupter of FIG. 1, where the fireproof separator boards are disposed on two sides inside the lower base.
Figure 3:
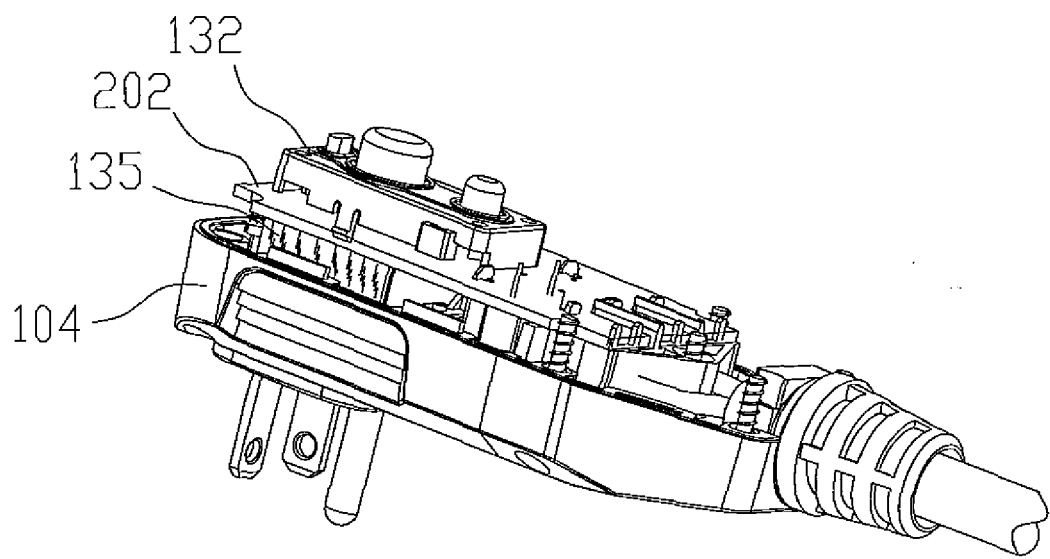
FIG. 3 illustrates the fireproof separator boards of the circuit interrupter of FIG. 1, where the fireproof separator boards are disposed on two sides inside the lower base.

As shown in FIGS. 1-3, the plug-based circuit interrupter 100 has an insulating casing formed by an upper cover 102, a lower base 104 and a rear cover 106. The base 104 couples with the front portion of the upper cover 102, and is attached to the upper cover 102 by a number of screws 107. The rear cover 106 couples with a rear portion of the upper cover 102 and also couples with a rear end of the base 104, and is attached to the upper cover 102 by a number of screws 108. The upper cover 102 and the rear cover 106 respectively have a half-circle shaped opening on one of their ends, so that when the two openings are assembled together they form a round opening to accommodate a cable cladding 112. The cable cladding 112 is used to bound and hold the output electrical cables (not shown), which typically include an output phase line, an output neutral line and an output ground line. The upper cover 102 is provided with assembly holes 114, 116, 118 through it. A waterproof cap 120 forms protrusions corresponding to the assembly holes, including a protrusion for covering a power indicator light 122, a cylindrical shaped protrusion for covering a reset button 124, and a cylindrical shaped protrusion for covering a test button 126. Thus, when the waterproof cap 120 is assembled, the protrusions respectively protrude from the upper cover 102, so that the user can depress the reset button 124 and test button 126, and the power indicator light 122 can indicate to the user whether the device is energized. Those skilled in the art will understand that the waterproof cap 120 is optional.

The lower base 104 has two through holes for accommodating two insertion plates; a first metal insertion plate 128 has one end that passes through one through hole to extend out of the base 104, and a second metal insertion plate 130 has one end that passes through the other through hole to extend out of the base 104, for connecting to an input power source. The input ground pin 127 passes through the base 104 to enter the casing and is affixed to and electrically coupled to one end of a metal ground plate 131 inside the casing.

A movement component 200 is disposed inside the casing of the plug-based circuit interrupter. Specifically, the movement component 200 includes a control circuit board 202 which has a pair of moving contact arms 206, 208, a mounting frame, a tripping mechanism, and output wiring blocks 212, 214 and 216 for respectively affixing the output phase line, output neutral line and output ground line of the output lines. The output wiring block 216 for the output ground line is affixed to and electrically connected to another end of the metal ground plate 131. An inner cover 132 is disposed between the upper cover 102 and the control circuit board 202. The end of the test button 126 opposed to the waterproof cover 120 is electrically connected to the electrical components of the control circuit board 202, and can be used to test whether the device is operating normally via a simulation test switch 136 on the control circuit board 202. The end of the reset button 124 is disposed against a reset spring 134 which is situated in a seat in the base.

The ends of the insertion plates 128, 130 located in the casing are affixed to a positioning groove of the mounting frame. The insertion plates 128, 130 have contact terminals 128a, 130a. Moving contact arms 206, 208 have contact terminals 206c, 208c respectively located directly above the contact terminals 128a, 130a of the insertion plates 128, 130. The connection and disconnection of these contact terminals cause the circuit to be closed or open.

In use, when electricity is connected, the surfaces of the contact terminals may be burned or oxidized, which can cause the resistance of the contact terminals to increase, which in turn can causes the temperature of the contact terminals to increase significantly. The above two phenomena can cause the plastic casing to deform, melt or burn, and can cause fire hazard.

Therefore, as shown in FIGS. 1-3, the plug-based circuit interrupter further includes two fireproof separator boards 135, 137, disposed vertically and respectively on the side of the two pairs of contact terminals 130a, 208c and 128a, 206c. The fireproof separator boards are formed of high temperature resistant boards, and can use epoxy board, asbestos board, mica plate, metal plate, ceramic material or other fire retardant, high temperature resistant materials. As shown in FIGS. 2 and 3, the two fireproof separator boards 135, 137 are disposed below the control circuit board 202, installed in a slot 104a of the base 104. The slot 104a of the base 104 limits the front-back and left-right movements of the fireproof separator boards 135, 137, and the control circuit board 202 limits the up-down movement of the fireproof separator boards 135, 137. Thus, the fireproof separator boards 135, 137 are securely mounted inside the casing.

Because fireproof separator boards are provided under the control circuit board on both sides, the control circuit board and fireproof separator boards completely block the conduction of high temperature from the contact terminals to the casing. Further, because the circuit board itself is made of a high temperature resistant and fire retardant material, it forms a high temperature resistant isolation cover over the two pairs of contact terminals. This way, the high temperature generated by the contact terminals will not be directly conducted to the insulating casing, but rather, it will be first conducted to the fireproof separator boards 135, 137. Because the fireproof separator boards cuts off the heat conduction toward the insulating casing, only a very small amount of heat is conducted to the insulating casing; this greatly reduces the temperature of the casing, and protects the casing from melting and burning. This invention also has the advantage of being low cost, safe and reliable, easy to assemble, etc.

Figure 4A:
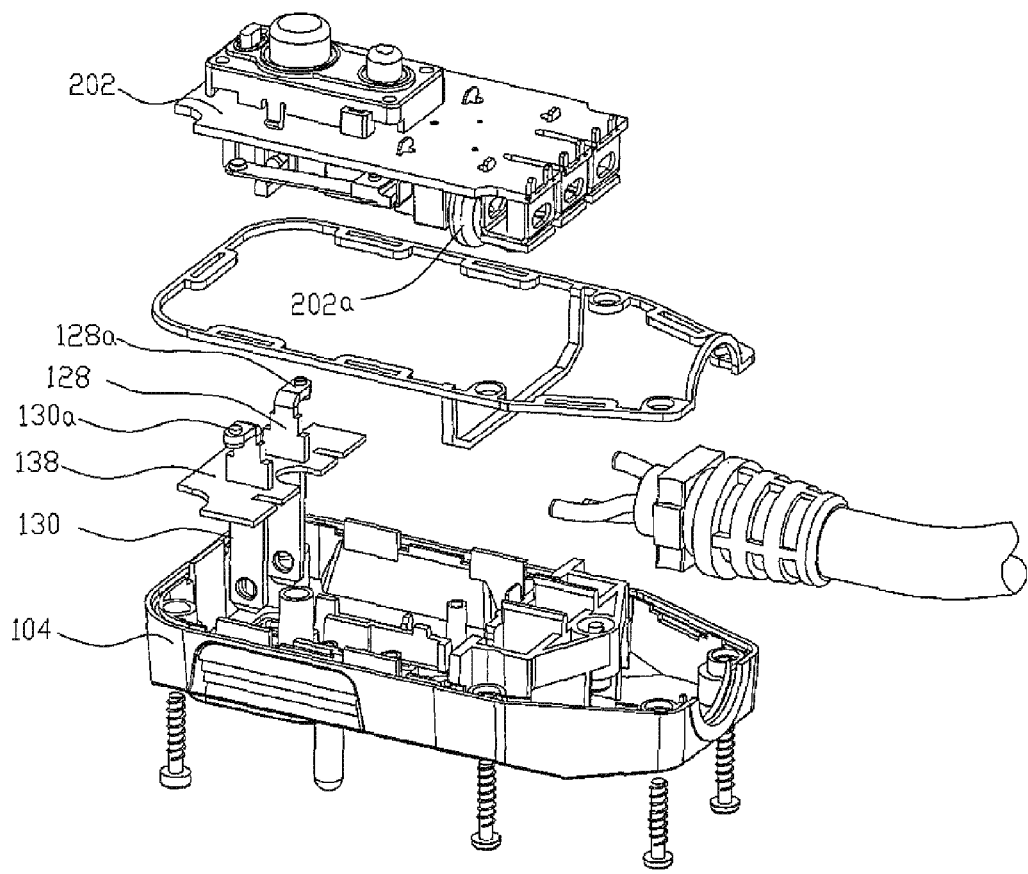
FIGS. 4a-4b illustrate a fireproof separator board according to another embodiment of the present invention, where the fireproof separator board is disposed horizontally on a bottom surface of the lower base.
Figure 4B:
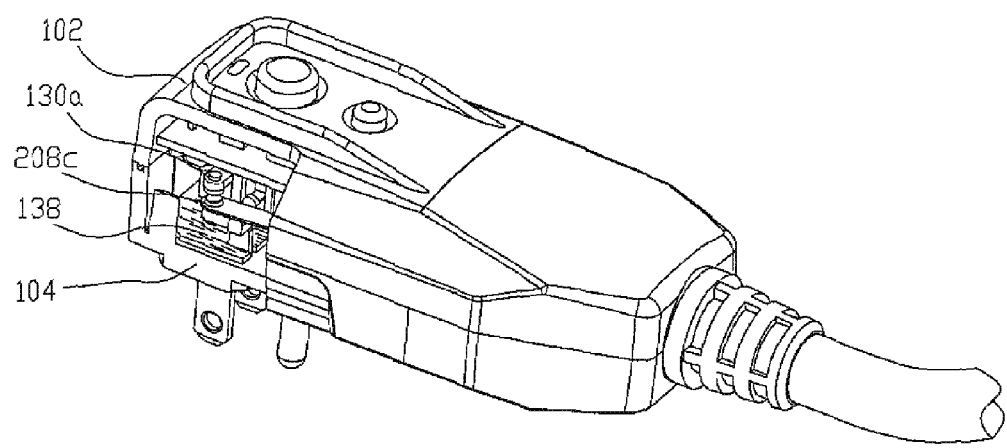

FIGS. 4a-4b illustrate a fireproof separator board according to another embodiment of the present invention. The fireproof separator board 138 is disposed on the bottom of the interior of base 104; the two insertion plates 130, 128 pass through the fireproof separator board 138 and are then inserter into the respective through holes of the base. The fireproof separator board 138 is located below the two pairs of contact terminals 128a, 130a and 206c, 208c, and along with the control circuit board 202, blocks the high temperature generated by the contact terminals from being conducted to the upper cover 102 and base 104 of the insulating casing.

Figure 5:
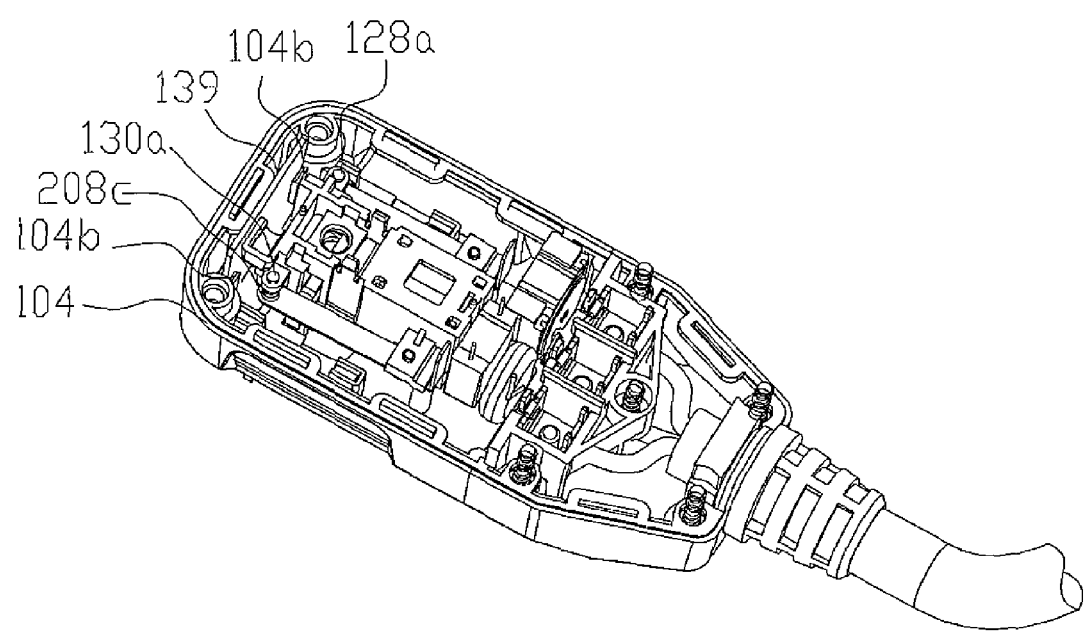
FIG. 5 illustrates a fireproof separator board according to another embodiment of the present invention, where the fireproof separator board is disposed in a front part inside the lower base.

FIG. 5 illustrates another embodiment of the present invention. The fireproof separator board 139 is disposed at a front location of the interior of the base 104 (toward the left in FIG. 5), affixed in a slot 104b of the base and is located below the control circuit board 202, so that the position of the fireproof separator board 139 inside the base 104 is secured. The fireproof separator board 139 and the control circuit board 202 together block the high temperature generated by the contact terminals 128a, 130a and 206c, 208c from being conducted to the upper cover 102 and base 104 of the insulating casing.

Figure 6A:
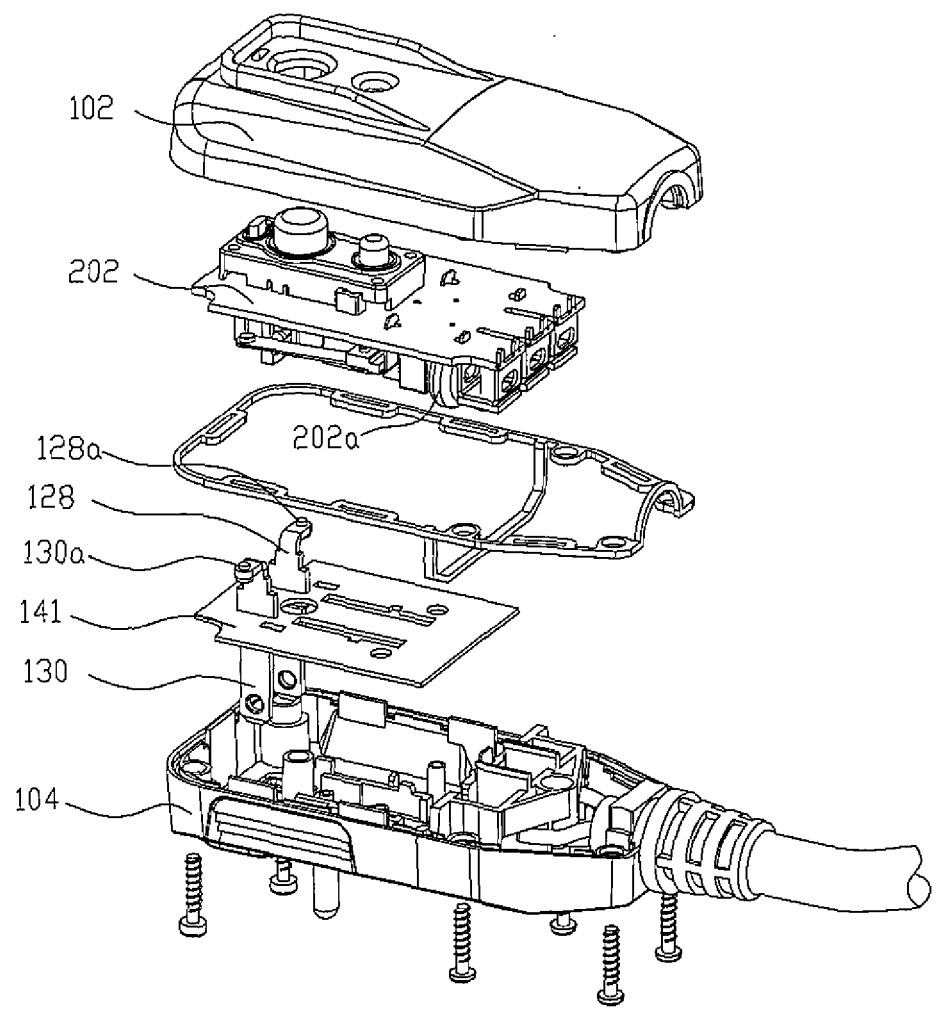
FIGS. 6a-6b illustrate a fireproof separator board according to another embodiment of the present invention, where the fireproof separator board is disposed inside the lower base to cover the entire bottom surface thereof.
Figure 6B:
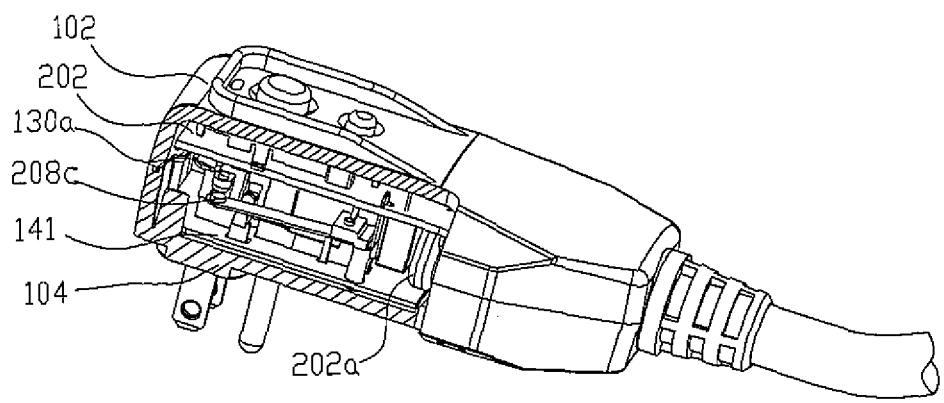

FIGS. 6a-6b illustrate a fireproof separator board according to another embodiment of the present invention. Similar to the embodiment in FIGS. 4a-4b, the fireproof separator board 141 is disposed on the bottom of the interior of base 104; the two insertion plates 130, 128 pass through the fireproof separator board 141 and are then inserter into the respective through holes of the base. The fireproof separator board 141 extends to below the varistor 202a of the control circuit board 202; i.e., the fireproof separator board 141 is located below the two pairs of contact terminals 128a, 130a and 206c, 208c and the varistor 202a, substantially covering the entire bottom surface of the base. The fireproof separator board 141 and the control circuit board 202 together block the high temperature generated by the contact terminals from being conducted to the upper cover 102 and base 104 of the insulating casing. Meanwhile, the design also prevents the varistor 202a from catching fire and burning the insulating casing when the device is struck by lightning.

Figure 7:
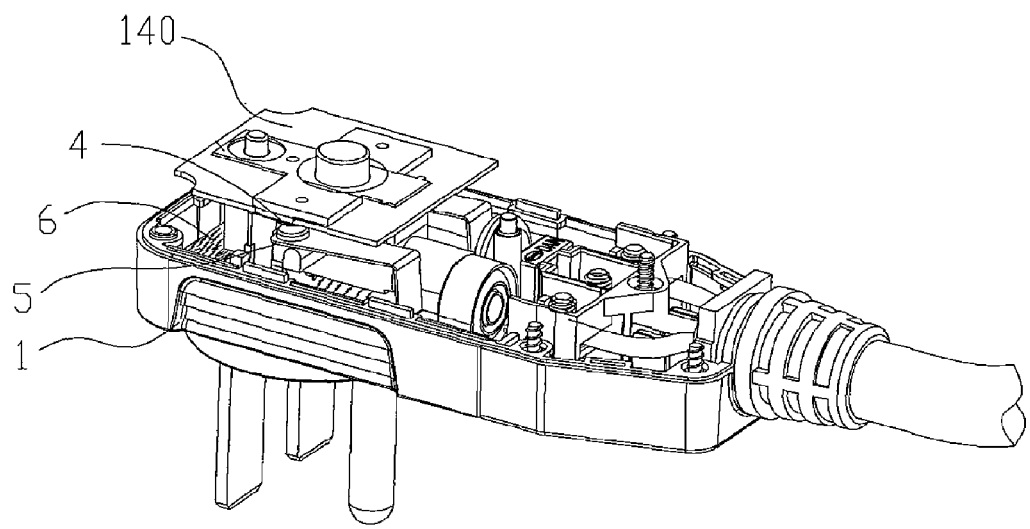
FIG. 7 illustrates a fireproof separator board according to another embodiment of the present invention, where the fireproof separator board is disposed above the contact terminals.

FIG. 7 illustrates another embodiment of the present invention. The fireproof separator board 140 is located above the stationary contacting terminal 4 and moving contact terminal 5, and together with the circuit board 6 below the stationary contacting terminal 4 and moving contact terminal 5, blocks the high temperature generated by the contact terminals from being conducted to the base 1 and the upper cover (not shown in the drawing).

Figure 8:
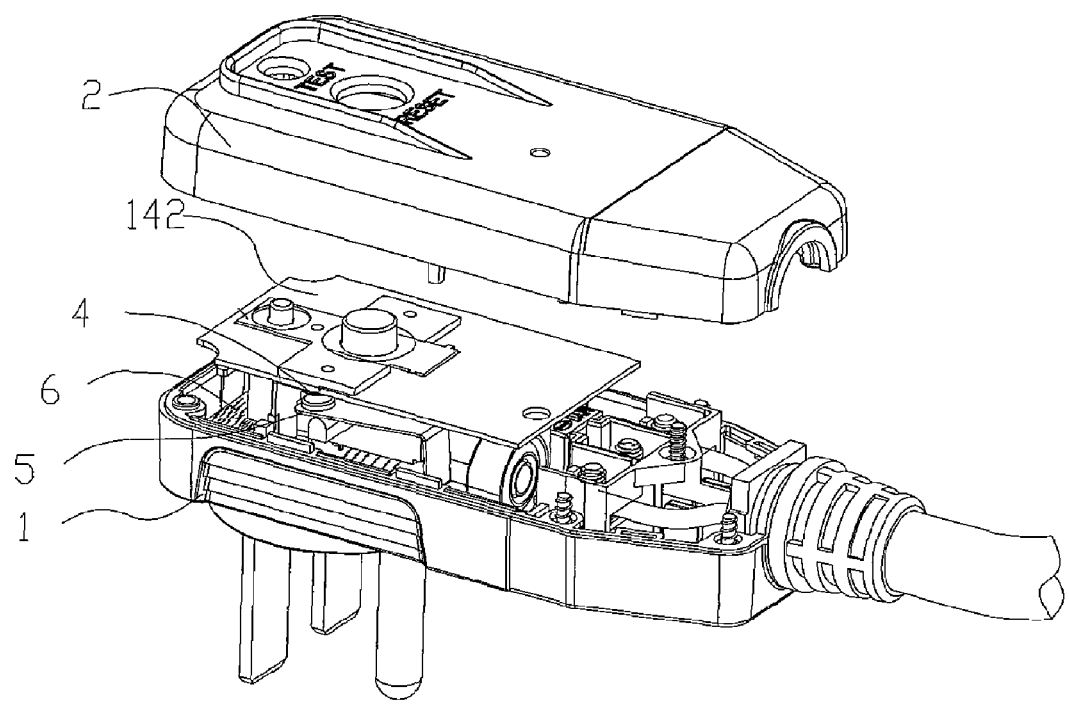
FIG. 8 illustrates a fireproof separator board according to another embodiment of the present invention, where the fireproof separator board is disposed above the varistor of the PCB.

FIG. 8 illustrates another embodiment of the present invention. Similar to the embodiment of FIG. 7, the fireproof separator board 142 is located above the stationary contact terminal 4, the moving contact terminal 6 and all of the electrical components of the circuit board including the varistor, and substantially parallel to the circuit board 6 below it. The fireproof separator board 142 together with the circuit board 6 below it blocks the high temperature generated by the contact points from being conducted to the upper and lower caseins 2 and 1. Also, the fireproof separator board 142 together with the circuit board 6 prevents the varistor from catching fire and burning the casings 1 and 2 when the device is struck by lightning.

The embodiments and technical schemes and characteristics of the present invention are disclosed above. However, it should be understood that based on the principles of the invention as well as various other combinations of the characteristics, those skilled in the art can make various modification and improvements, which are within the scope of protection of this invention. The above described embodiments are illustrative and do not limit the scope of the invention which are defined by the appended claims.

What is claimed is:

1. A plug-based circuit interrupter, comprising:
   an insulating casing;
   a control circuit board, disposed horizontally inside the insulating casing, the control circuit board including a first contact terminal, a second contact terminal, and a varistor;
   a first metal insertion plate and a second metal insertion plate, passing through a bottom of the insulating casing and being disposed vertically, the first and second metal insertion plates being connected to or disconnected from the respective first and second contact terminals to close or open an electrical circuit; and
   a fireproof separator board, formed of a flame retardant, high temperature resistant material, disposed within the insulating casing, for preventing heat generated by the first and second contact terminals from being conducted to the insulating casing.

2. The plug-based circuit interrupter of claim 1, wherein the fireproof separator board is formed of epoxy board, asbestos board, mica plate, metal plate, or a ceramic material.

3. The plug-based circuit interrupter of claim 1, comprising two fireproof separator boards, the two fireproof separator boards being disposed vertically and respectively between two side walls of the insulating casing and the first and second contact terminals.

4. The plug-based circuit interrupter of claim 1, wherein the fireproof separator board is disposed below the control circuit board and parallel to the control circuit board, and wherein the first and second metal insertion plates respectively pass through the fireproof separator board.

5. The plug-based circuit interrupter of claim 4, wherein the fireproof separator board extends below the varistor of the control circuit board.

6. The plug-based circuit interrupter of claim 1, wherein an end of the fireproof separator board near the casing is disposed vertically between the first and second contact terminals.

7. A plug-based circuit interrupter, comprising:
   an insulating casing;
   a control circuit board disposed inside the insulating casing and including a varistor;
   a stationary contact terminal and a moving contact terminal, disposed inside the insulating casing and above the control circuit board; and
   a fireproof separator board, disposed above the stationary contact terminal and the moving contact terminal, and cooperating with the control circuit board to prevent heat generated by the stationary contact terminal and the moving contact terminal from being conducted to the insulating casing.

8. The plug-based circuit interrupter of claim 7, wherein the fireproof separator board extends above the varistor of the control circuit board.

9. The plug-based circuit interrupter of claim 7, wherein the fireproof separator board is formed of epoxy board, asbestos board, mica plate, metal plate, or a ceramic material.

* * * * *